United States Patent
Lee et al.

(10) Patent No.: US 12,010,899 B1
(45) Date of Patent: Jun. 11, 2024

(54) DISPLAY APPARATUS HAVING A LIGHT-EMITTING DEVICE AND AN OPTICAL LENS

(71) Applicant: LG Display Co., Ltd., Seoul (KR)

(72) Inventors: Tae Gyu Lee, Paju-si (KR); Jung Eun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/362,871

(22) Filed: Jul. 31, 2023

(30) Foreign Application Priority Data

Dec. 13, 2022 (KR) .......................... 10-2022-0173495

(51) Int. Cl.
| | |
|---|---|
| H10K 59/40 | (2023.01) |
| G06F 3/044 | (2006.01) |
| H10K 59/122 | (2023.01) |
| H10K 59/80 | (2023.01) |
| G06F 3/041 | (2006.01) |

(52) U.S. Cl.
CPC ......... *H10K 59/879* (2023.02); *G06F 3/0443* (2019.05); *H10K 59/122* (2023.02); *H10K 59/40* (2023.02); *H10K 59/873* (2023.02); *H10K 59/8792* (2023.02); *G06F 3/0412* (2013.01); *G06F 2203/04114* (2019.05)

(58) Field of Classification Search
None
See application file for complete search history.

(56) References Cited

U.S. PATENT DOCUMENTS

| | | | |
|---|---|---|---|
| 9,818,966 | B2 | 11/2017 | Noh |
| 2008/0309224 | A1* | 12/2008 | Kwak ................ H10K 59/8723 |
| | | | 313/504 |
| 2017/0125719 | A1 | 5/2017 | Noh |
| 2019/0221779 | A1* | 7/2019 | Jang ..................... H10K 50/844 |
| 2020/0066804 | A1* | 2/2020 | Jung ..................... H10K 59/38 |

(Continued)

FOREIGN PATENT DOCUMENTS

| | | |
|---|---|---|
| JP | 2013-026021 A | 2/2013 |
| KR | 10-2017-0051676 A | 5/2017 |
| KR | 10-2022-0033770 A | 3/2022 |

OTHER PUBLICATIONS

Intellectual Property Office of the United Kingdom, Combined Search and Examination Report, United Kingdom Patent Application No. GB2313258.2, Feb. 12, 2024, nine pages.

*Primary Examiner* — Krishna P Neupane
(74) *Attorney, Agent, or Firm* — Fenwick & West LLP

(57) ABSTRACT

A display apparatus includes a light-emitting device and an optical lens are stacked on an emission area of a device substrate. A black matrix and a touch electrode may be disposed on a non-emission area of the device substrate. An encapsulation unit covering the light-emitting device and an optical insulating layer covering the black matrix may be disposed on the emission area and the non-emission area of the device substrate. The touch electrode and the optical lens may be disposed on the optical insulating layer. A lens barrier may be disposed on the optical insulating layer. The optical lens may be surrounded by the lens barrier. Thus, in the display apparatus, a deform of the optical lens due to a reflow process may be prevented. Therefore, in the display apparatus, decreasing the quality of the image due to a process of forming the optical lens may be prevented.

20 Claims, 7 Drawing Sheets

(56) References Cited

U.S. PATENT DOCUMENTS

| | | |
|---|---|---|
| 2020/0119113 A1* | 4/2020 | Lee ..................... G06F 3/0446 |
| 2021/0193968 A1 | 6/2021 | Lee et al. |
| 2021/0200382 A1 | 7/2021 | Lee et al. |
| 2022/0077431 A1 | 3/2022 | Lee et al. |
| 2022/0199700 A1 | 6/2022 | Shin et al. |
| 2022/0199715 A1* | 6/2022 | Kim ..................... H10K 59/38 |

* cited by examiner

DISPLAY APPARATUS HAVING A LIGHT-EMITTING DEVICE AND AN OPTICAL LENS

CROSS-REFERENCE TO RELATED APPLICATIONS

This application claims the benefit of Republic of Korea Patent Application No. 10-2022-0173495, filed on Dec. 13, 2022, which is hereby incorporated by reference as if fully set forth herein.

BACKGROUND

Field

The present disclosure relates to a display apparatus in which a light-emitting device and an optical lens are disposed on each emission area of a device substrate.

Discussion of the Related Art

Generally, a display apparatus provides an image. For example, the display apparatus may include a plurality of pixel areas. An emission area may be defined in each pixel area. For example, a light-emitting device and an optical lens may be disposed in the emission area of each pixel area.

The light-emitting device may emit light displaying a specific color. For example, the light-emitting device may include a first electrode, a light-emitting layer and a second electrode, which are sequentially stacked. The optical lens may concentrate the light emitted from the light-emitting device. For example, the optical lens of each pixel area may have a size larger than the emission area of the corresponding pixel area.

A surface of the optical lens may be a curved surface. For example, a cross-section of the optical lens may be a hemispherical shape. The optical lens may be formed by a reflow process. However, in the display apparatus, the optical lens of each pixel area may be in contact with the optical lense of adjacent pixel area by the reflow process. Thus, in the display apparatus, a shape of some of the optical lenses may be deformed. The shape deviation of the optical lenses may distort the realized image. Therefore, in the display apparatus, the quality of the image may be decreased by the process of forming the optical lenses.

SUMMARY

Accordingly, the present disclosure is directed to a display apparatus that substantially obviates one or more problems due to limitations and disadvantages of the related art.

An object of the present disclosure is to provide a display apparatus capable of preventing the quality of the image from decreasing due to the process of forming the optical lenses.

Another object of the present disclosure is to provide a display apparatus capable of preventing the deform of each optical lens due to the reflow process.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. A bank insulating layer is disposed on the device substrate. The bank insulating layer defines an emission area. A light-emitting device is disposed on the emission area. An encapsulation unit is disposed on the bank insulating layer and the light-emitting device. A black matrix and an optical lens are disposed on the encapsulation unit. The black matrix overlaps the bank insulating layer. The optical lens overlaps the emission area. An optical insulating layer is disposed between the encapsulation unit and the optical lens. The optical insulating layer covers the black matrix. A touch electrode and a lens barrier are disposed on the optical insulating layer. The touch electrode overlaps the black matrix. The lens barrier surrounds the optical lens.

The lens barrier may include an insulating material.

The lens barrier may be in contact with an edge of the optical lens.

The lens barrier may extend along the edge of the optical lens.

The lens barrier may be in contact with an upper surface of the optical insulating layer opposite to the device substrate.

The lens barrier may include a same material as the optical insulating layer.

A bridge electrode may be disposed between the black matrix and the optical insulating layer. The bridge electrode may be electrically connected to the touch electrode.

The bridge electrode may be in contact with an upper surface toward the touch electrode.

An end of the touch electrode may be disposed on the lens barrier.

A thickness of the lens barrier may be larger than a thickness of the touch electrode.

In another embodiment, there is provided a display apparatus comprising a device substrate. The device substrate includes emission areas and a non-emission area. The non-emission area is disposed between the emission areas. Light-emitting devices are disposed on the emission areas of the device substrate. An encapsulation unit is disposed on the light-emitting devices. The encapsulation unit extends on the non-emission area of the device substrate. A black matrix is disposed on the encapsulation unit. The black matrix overlaps the non-emission area. An optical insulating layer is disposed on the black matrix. The optical insulating layer extends the emission areas of the device substrate. Touch electrodes, the optical lenses and lens barriers are disposed on the optical insulating layer. The touch electrodes overlap the black matrix. The optical lenses overlap the emission areas. The lens barriers are disposed between the optical lenses.

Each of the optical lenses may be surrounded by the lens barriers. A plane of each lens barrier may have a shape different from an outline of the corresponding optical lens.

Each of the lens barriers may be disposed on an edge of one of the touch electrodes.

The lens barriers may include a same material as the touch electrodes.

The lens barriers may be spaced apart from the optical lenses.

In another embodiment, a display apparatus includes a substrate having a first emission area and a second emission area. A first light-emitting device is in the first emission area and a second light-emitting device is in the second emission area. The display apparatus includes an optical insulating layer on the first light-emitting device and the second light-emitting device, a first optical lens on the optical insulating layer. At least a portion of the first optical lens overlaps with the first light-emitting device. The display apparatus includes a second optical lens on the optical insulating layer. At least a portion of the second optical lens overlaps with the second light-emitting device. The display apparatus also includes a lens barrier on the optical insulating layer. The lens barrier protrudes above the optical insulating layer in a first direction and is disposed between the first optical lens and the second optical lens.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
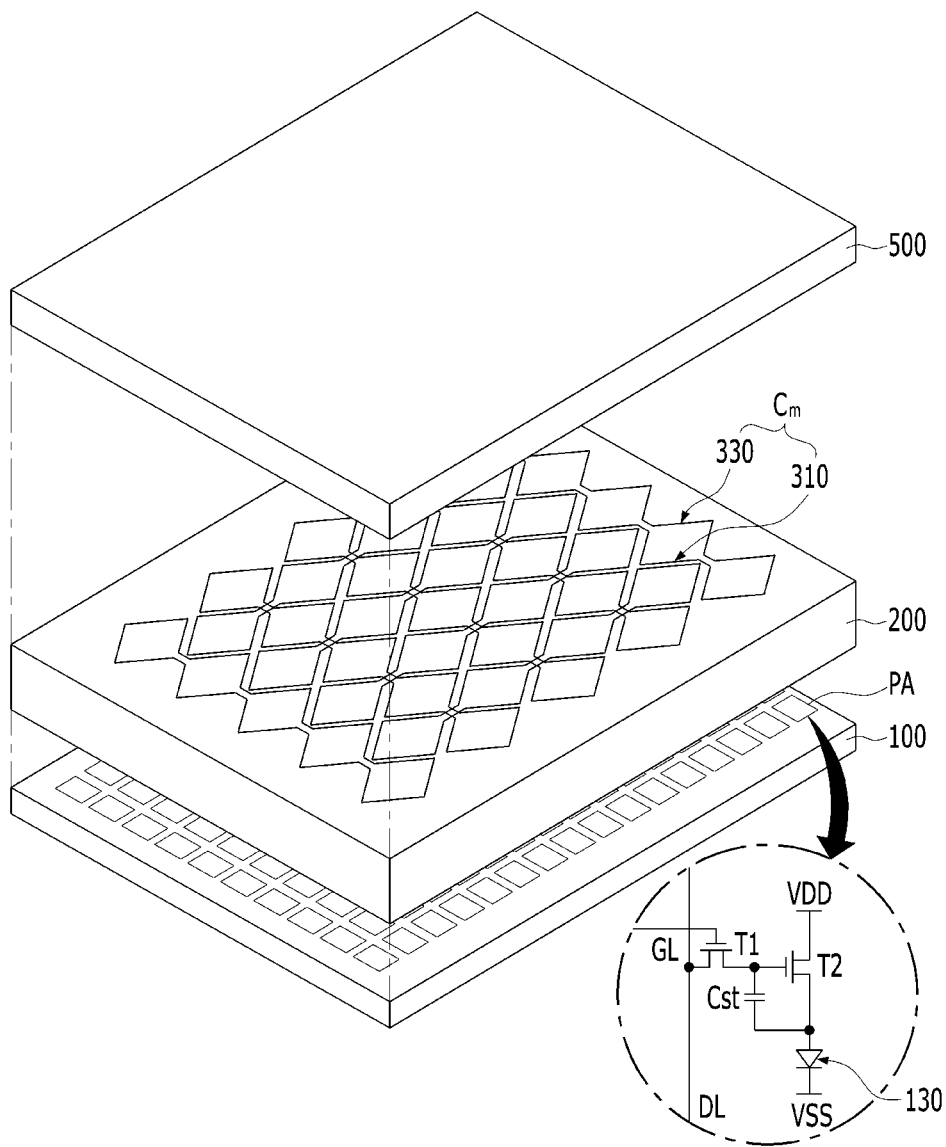
FIGS. 1 and 2 are views schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
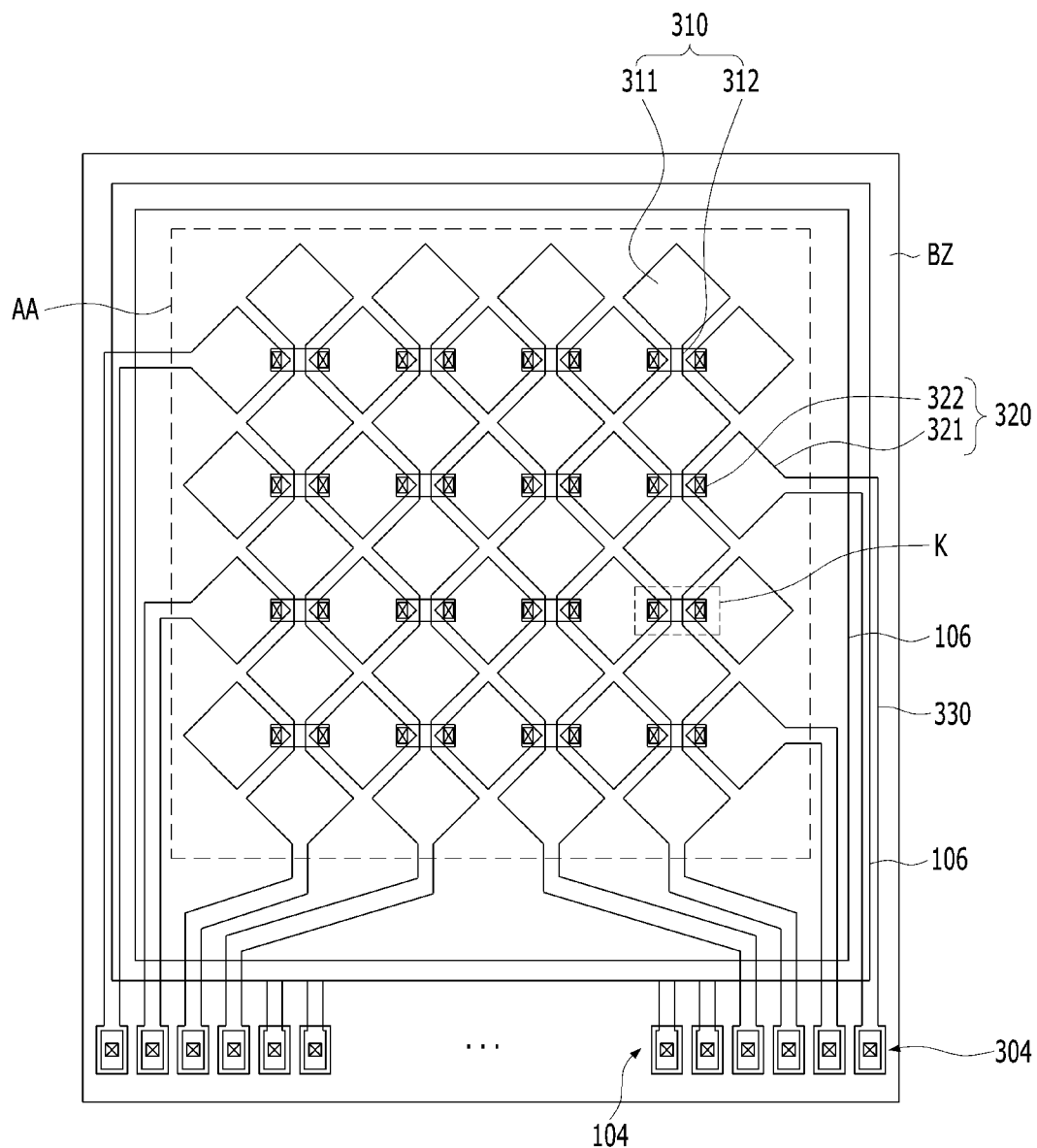
Figure 3:
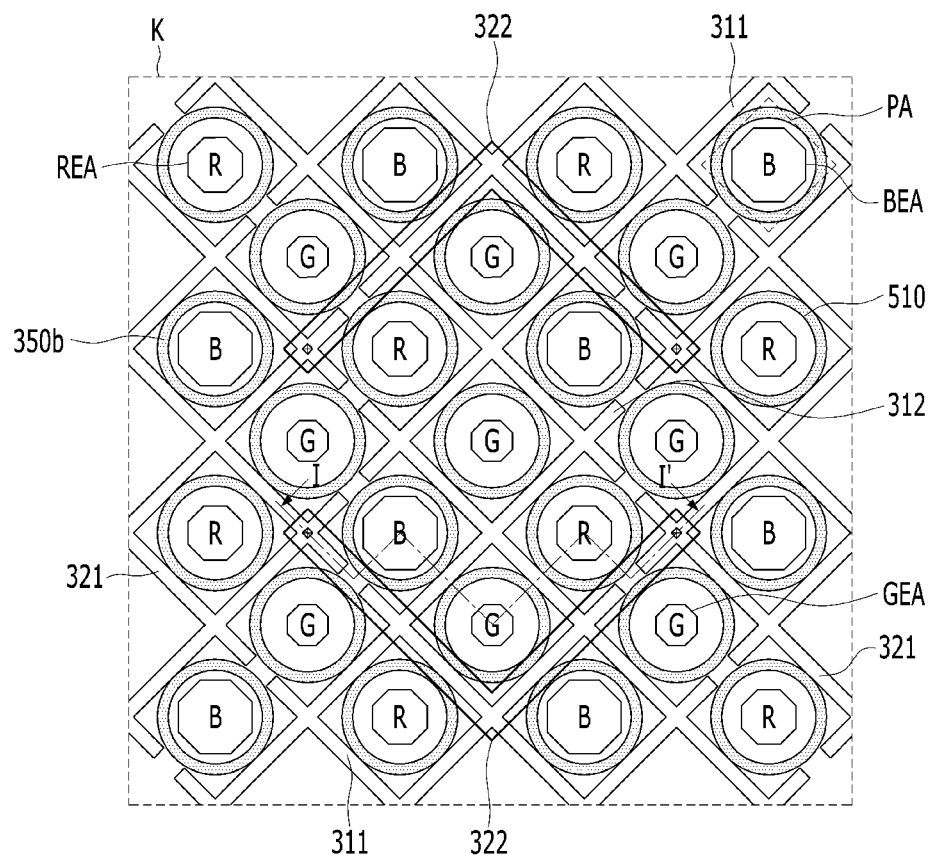
FIG. 3 is an enlarged view of K in FIG. 2, according to an embodiment of the present disclosure.
Figure 4:
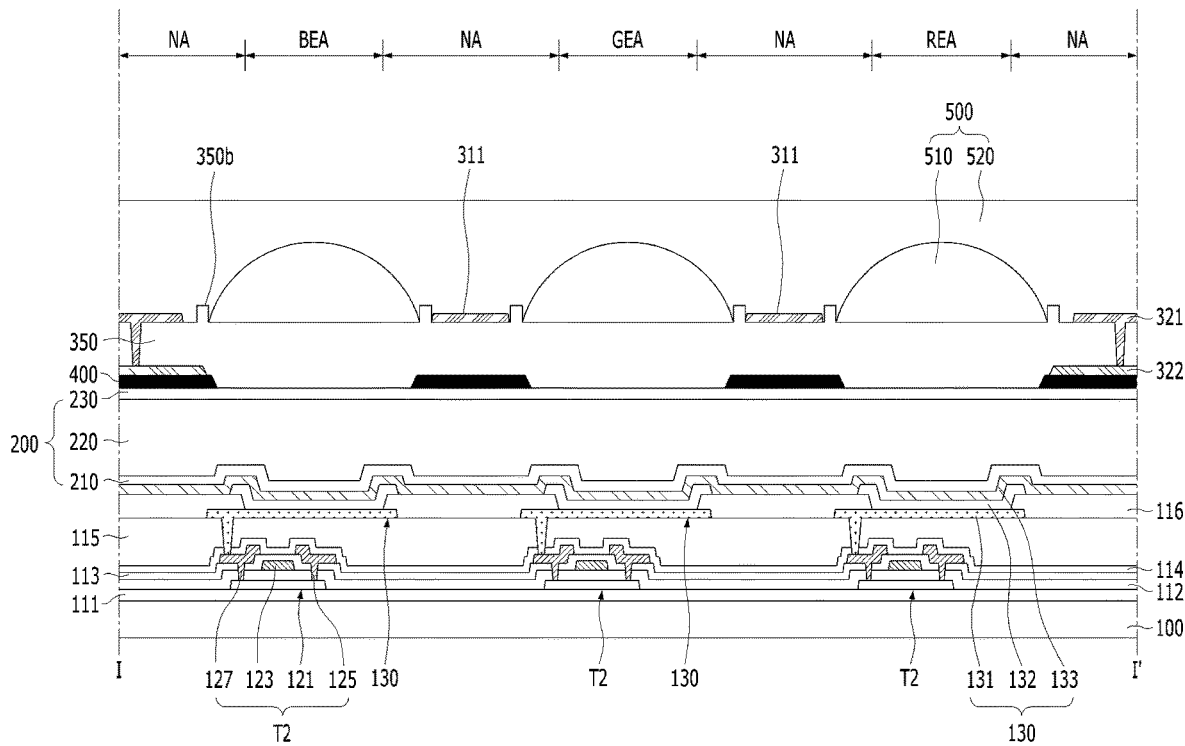
FIG. 4 is a view taken along I-I' of FIG. 3 according to an embodiment of the present disclosure.

FIGS. 1 and 2 are a view schematically showing a display apparatus according to an embodiment of the present disclosure. FIG. 3 is an enlarged view of K in FIG. 2 according to an embodiment of the present disclosure. FIG. 4 is a view taken along I-I' of FIG. 3 according to an embodiment of the present disclosure.

Referring to FIGS. 1 to 4, the display apparatus according to the embodiment of the present disclosure may include a device substrate 100. The device substrate 100 may include an insulating material. For example, the device substrate 100 may include glass or plastic. The device substrate 100 may include a display area AA and a bezel area BZ. The display area AA may be an area in which an image provided to a user is generated. For example, a plurality of pixel area PA may be disposed in the display area AA.

Each of the pixel areas PA may realize a specific color. For example, a light-emitting device 130 and a pixel driving circuit electrically connected to a light-emitting device 130 may be disposed in each pixel area PA. The light-emitting device 130 may emit light displaying a specific color. For example, the light-emitting device 130 may include a first electrode 131, a light-emitting layer 132 and a second electrode 133, which are sequentially stacked on the device substrate 100.

The first electrode 131 may include a conductive material. The first electrode 131 may include a material having high reflectance. For example, the first electrode 131 may be a metal, such as aluminum (Al) and silver (Ag). The first electrode 131 may have a multi-layer structure. For example, the first electrode 131 may have a structure in which a reflective electrode made of a metal is disposed between transparent electrodes made of a transparent conductive material, such as ITO and IZO.

The light-emitting layer 132 may generate light having luminance corresponding to a voltage difference between the first electrode 131 and the second electrode 133. For example, the light-emitting layer 132 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 132 may have a multi-layer structure. For example, the light-emitting layer 132 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 132 may be improved.

The second electrode 133 may include a conductive material. The second electrode 133 may include a material different from the first electrode 131. A transmittance of the second electrode 133 may be higher than a transmittance of the first electrode 131. For example, the second electrode 133 may be a transparent electrode made of a transparent conductive material, such as ITO and IZO. Thus, in the display apparatus according to the embodiment of the present disclosure, the light generated by the light-emitting layer 132 may be emitted outside through the second electrode 133.

Various signals may be provided in the pixel driving circuit of each pixel area PA. For example, the pixel driving circuit of each pixel area PA may be electrically connected to one of gate lines GL applying a gate signal and one of data lines DL applying a data signal. The pixel driving circuit of each pixel area PA may supply a driving current corresponding to the data signal to the light-emitting device 130 of the corresponding pixel area PA according to gate signal for one frame. For example, the pixel driving circuit of each pixel area PA may include a first thin film transistor T1, a second thin film transistor T2 and a storage capacitor Cst.

The first thin film transistor T1 may include a first semiconductor pattern, a first gate electrode, a first source electrode and a first drain electrode. The first thin film transistor T1 may transmit the data signal to the second thin film transistor T2 according to the gate signal. For example, the first thin film transistor T1 may be a switching thin film transistor. The first gate electrode of the first thin film transistor T1 may be electrically connected to the corresponding gate line GL, and the first source electrode of the first thin film transistor T1 may be electrically connected to the corresponding date line DL.

The second thin film transistor T2 may include a second semiconductor pattern 121, a second gate electrode 123, a second source electrode 125 and a second drain electrode 127. The second thin film transistor T2 may generate the driving current corresponding to the data signal. For example, the second thin film transistor T2 may be a driving thin film transistor. The second gate electrode 123 of the second thin film transistor T2 may be electrically connected to the first drain electrode of the first thin film transistor T1, and the second source electrode 125 of the second thin film transistor T2 may be electrically connected to a signal line supplying the positive power voltage (VDD). The light-emitting device 130 may be electrically connected to the second thin film transistor T2. For example, the second drain electrode 127 of the second thin film transistor T2 may be electrically connected to the light-emitting device 130.

The second semiconductor pattern 121 may include a semiconductor material. For example, the second semiconductor pattern 121 may include an oxide semiconductor, such as IGZO. The second semiconductor pattern 121 may include a source region, a channel region and a drain region. The channel region may be disposed between the source region and the drain region. The source region and the drain region may have a resistance lower than the channel region. For example, the source region and the drain region may include a conductive region of an oxide semiconductor. The channel region may be a region of an oxide semiconductor, which is not conductorized.

The second semiconductor pattern 121 may include a second channel region between a second drain region and a second source region. The second drain region and a second source region may have a resistance smaller than the second channel region. For example, the second drain region and the second source region may include a conductive impurity. The second channel region may be a region in which the conductive impurity is not doped.

The second gate electrode 123 may include a conductive material. For example, the second gate electrode 123 may include a metal, such as aluminum (Al), chrome (Cr), copper (Cu), molybdenum (Mo), titanium (Ti) and tungsten (W). The second gate electrode 123 may be disposed on the second semiconductor pattern 121. For example, the second gate electrode 123 may overlap the channel region of the second semiconductor pattern 121. The second gate electrode 123 may be insulated from the second semiconductor pattern 121. For example, the channel region of the second semiconductor pattern 121 may have an electrical conductivity corresponding to a voltage applied to the second gate electrode 123.

The second source electrode 125 may include a conductive material. For example, the second source electrode 125 may include a metal, such as aluminum (Al), chrome (Cr), copper (Cu), molybdenum (Mo), titanium (Ti) and tungsten (W). The second source electrode 125 may include a material different from the second gate electrode 123. The second source electrode 125 may be disposed on a layer different from the second gate electrode 123. For example, the second source electrode 125 may be insulated from the second gate electrode 123. The second source electrode 125 may be electrically connected to the source region of the second semiconductor pattern 121.

The second drain electrode 127 may include a conductive material. For example, the second drain electrode 127 may include a metal, such as aluminum (Al), chrome (Cr), copper (Cu), molybdenum (Mo), titanium (Ti) and tungsten (W). The second drain electrode 127 may include a material different from the second gate electrode 123. The second drain electrode 127 may be disposed on a layer different from the second gate electrode 123. For example, the second drain electrode 127 may be insulated from the second gate electrode 123. The second drain electrode 127 may be disposed on a same layer as the second source electrode 125. The second drain electrode 127 may include a same material as the second source electrode 125. For example, the second drain electrode 127 may be formed simultaneously with the second source electrode 125. The second drain electrode 127 may be insulated from the second source electrode 125. For example, the second drain electrode 127 may be electrically connected to the drain region of the second semiconductor pattern 121.

The first thin film transistor T1 may be formed simultaneously with the second thin film transistor T2. For example, the first semiconductor pattern of the first thin film transistor T1 may include a same material as the second semiconductor pattern 121 of the second thin film transistor T2, and the first gate electrode of the first thin film transistor T1 may include a same material as the second gate electrode 123 of the second thin film transistor T2. The first source electrode and the first drain electrode of the first thin film transistor T1 may be disposed on a layer same as the second source electrode 125 and the second drain electrode 127 of the second thin film transistor T2.

The storage capacitor Cst may maintain a signal applied to the second gate electrode 123 of the second thin film transistor T2 for one frame. For example, the storage capacitor Cst may be electrically connected between the second gate electrode 123 and the second drain electrode 127 of the second thin film transistor T2. The storage capacitor Cst may have a stacked structure of capacitor electrodes. For example, the storage capacitor Cst may be formed by using a process of forming the first thin film transistor T1 and the second thin film transistor T2. For example, the storage capacitor Cst may include a first capacitor electrode disposed on a layer same as the second gate electrode 123, and a second capacitor electrode disposed on a layer same as the second drain electrode 127.

A plurality of insulating layers 111, 112, 113, 114, 115 and 116 for preventing unnecessary electrical connection in each pixel area PA may be disposed on the device substrate 100. For example, a device buffer layer 111, a gate insulating layer 112, an interlayer insulating layer 113, a device passivation layer 114, an over-coat layer 115 and a bank insulating layer 116 may be disposed on the device substrate 100.

The device buffer layer 111 may be disposed close to the device substrate 100. The device buffer layer 111 may prevent pollution due to the device substrate 100 in a process of forming the pixel driving circuit in each pixel area PA. For example, an upper surface of the device substrate 100 toward the pixel driving circuit of each pixel area PA may be covered by the device buffer layer 111. The first thin film transistor T1 and the second thin film transistor T2 of each pixel area PA may be disposed on the device buffer layer 111. The device buffer layer 111 may include an insulating material. For example, the device buffer layer 111 may include an inorganic insulating material, such as silicon oxide (SiOx) and silicon nitride (SiNx). The device buffer layer 111 may include a multi-layer structure. For example, the device buffer layer 111 may have a stacked structure of an inorganic insulating layer made of silicon oxide (SiOx) and an inorganic insulating layer made of silicon nitride (SiNx).

The gate insulating layer 112 may insulate between the semiconductor pattern 121 and the gate electrode 123 of each thin film transistor T1 and T2. For example, the second semiconductor pattern 121 of each pixel area PA may be disposed between the device buffer layer 111 and the gate insulating layer 112. The gate insulating layer 112 may cover the first semiconductor pattern and the second semiconductor pattern 121 of each pixel area PA. The first gate electrode and the second gate electrode 123 of each pixel area PA may be disposed on the gate insulating layer 112. The gate insulating layer 112 may include an insulating material. For example, the gate insulating layer 112 may include an inorganic insulating material, such as silicon oxide (SiOx).

The interlayer insulating layer 113 may insulate the source electrode 125 and the drain electrode 127 of each thin film transistor T1 and T2 from the gate electrode 123 of the corresponding thin film transistor T1 and T2. For example, the second gate electrode 123 of the second thin film transistor T2 in each pixel area PA may be disposed between the gate insulating layer 112 and the interlayer insulating layer 113. The second source electrode 125 and the second drain electrode 127 of the second thin film transistor T2 in each pixel area PA may be disposed on the interlayer insulating layer 113. The interlayer insulating layer 113 may include an insulating material. For example, the interlayer insulating layer 113 may include an inorganic insulating material, such as silicon oxide (SiOx) and silicon nitride (SiNx). The interlayer insulating layer 113 may have a multi-layer structure.

The device passivation layer 114 may be disposed on the pixel driving circuit of each pixel area PA. The device passivation layer 114 may prevent damage of the pixel driving circuit of each pixel area PA due to external impact and moisture. The device passivation layer 114 may extend along a surface of each pixel driving circuit opposite to the device substrate 100. For example, the second source electrode 125 and the second drain electrode 127 of each pixel driving circuit may be covered by the device passivation layer 114. The device passivation layer 114 may include an insulating material. For example, the device passivation layer 114 may include an inorganic insulating material, such as silicon nitride (SiNx) and silicon oxide (SiOx).

The over-coat layer 115 may be disposed on the device passivation layer 114. The over-coat layer 115 may remove a thickness difference due to the pixel driving circuit of each pixel area PA. For example, a thickness difference due to the first thin film transistor T1 and the second thin film transistor T2 of each pixel area PA may be removed by the over-coat layer 115. An upper surface of the over-coat layer 115 opposite to the device substrate 100 may be a flat surface. The over-coat layer 115 may include an insulating material. The over-coat layer 115 may include a material different from the device passivation layer 114. For example, the over-coat layer 115 may include an organic insulating material.

The light-emitting device 130 of each pixel area PA may be disposed on the over-coat layer 115. For example, the first electrode 131, the light-emitting layer 132 and the second electrode 133 of each pixel area PA may be sequentially stacked on the over-coat layer 115 of the corresponding pixel area PA. The first electrode 131 of each pixel area PA may be in direct contact with the upper surface of the over-coat layer 115. Thus, in the display apparatus according to the embodiment of the present disclosure, a luminance deviation according to a generation position of the light emitted from each light-emitting device 130 may be prevented.

The first electrode 131 of each pixel area PA may be electrically connected to the second drain electrode 127 of the corresponding pixel area PA. For example, the device passivation layer 114 and the over-coat layer 115 may include electrode contact holes partially exposing the second drain electrode 127 of each pixel area PA, and the first electrode 131 of each light-emitting device 130 may be in direct contact with the second drain electrode 127 of the corresponding pixel area PA through one of the electrode contact holes.

The bank insulating layer 116 may be disposed on the over-coat layer 115. The bank insulating layer 116 may define an emission area BEA, GEA and REA in each pixel area PA. For example, the bank insulating layer 116 may cover an edge of the first electrode 131 in each pixel area PA. The light-emitting layer 132 and the second electrode 133 of each pixel area PA may be sequentially stacked on a portion of the corresponding first electrode 131 exposed by the bank insulating layer 116. For example, the light-emitting device 130 of each pixel area PA may be disposed on the emission area BEA, GEA and REA defined in the corresponding pixel area PA. The first electrode 131 of each pixel area PA may be insulated from the first electrode 131 of adjacent pixel area PA by the bank insulating layer 116. An area in which the bank insulating layer 116 is disposed may be a non-emission area NA in which light is not emitted. For example, the non-emission area NA may be disposed between the emission areas BEA, GEA and REA.

The light emitted from the light-emitting device 130 of each pixel area PA may display a color different from the light emitted from the light-emitting device 130 of adjacent pixel area PA. For example, the emission area BEA, GEA and REA defined in each pixel PA by the bank insulating layer 116 may be one of a blue emission area BEA through which light displaying blue is emitted, a green emission area GEA through which light displaying green is emitted, and a red emission area REA through which light displaying red is emitted. A size of each emission area BEA, GEA and REA may be different from a size of adjacent emission area BEA, GEA and REA.

The pixel areas PA may be disposed side by side in a first direction and a second direction perpendicular to the first direction. For example, in the display apparatus according to the embodiment of the present disclosure, a first row in which the pixel areas PA including the red emission area REA and the pixel areas PA including the blue emission area BEA are alternately disposed, and a second row in which the pixel areas PA including the green emission area GEA are disposed may be repeated in the column direction. The light emitted from the emission area BEA, GEA and REA of each pixel area PA may display a color different from the light emitted from the emission area BEA, GEA and REA of adjacent pixel area PA in the row direction, and the light emitted from the emission area BEA, GEA and REA of adjacent pixel area PA in the column direction. The row direction and the column direction may be different from the first direction and the second direction. For example, the display apparatus according to the embodiment of the present disclosure may have a pen-tile structure in which the red emission areas REA and the blue emission areas BEA of the first row are alternately arranged with the green emission areas GEA of the second row.

The light-emitting layer 132 of each pixel area PA may be spaced apart from the light-emitting layer 132 of adjacent pixel area PA. The light-emitting layer 132 of each pixel area PA may be formed, individually. For example, the light-emitting layer 132 of each pixel area PA may be formed by a fine metal mask (FMM).

A voltage applied to the second electrode 133 of each pixel area PA may be the same as a voltage applied to the second electrode 133 of adjacent pixel area PA. For example, the negative power voltage (VSS) may be applied to the second electrode 133 of each pixel area PA. The second electrode 133 of each pixel area PA may be electrically connected to the second electrode 133 of adjacent pixel area PA. The second electrode 133 of each pixel area PA may include a same material as the second electrode 133 of adjacent pixel area PA. For example, the second electrode 133 of each pixel area PA may be formed simultaneously with the second electrode 133 of adjacent pixel area PA. The second electrode 133 of each pixel area PA may be in direct contact with the second electrode 133 of adjacent pixel area PA. For example, the second electrode 133 of each pixel area PA may extend on the bank insulating layer 116. The bank insulating layer 116 may be covered by the second electrode 133. Thus, in the display apparatus according to the embodiment of the present disclosure, a process of forming the second electrode 133 in each pixel area PA may be simplified. And, in the display apparatus according to the embodiment of the present disclosure, the luminance of the light emitted from the light-emitting device 130 of each pixel area PA may be adjusted by the data signal applied to the pixel driving circuit of the corresponding pixel area PA.

An encapsulation unit 200 may be disposed on the light-emitting device 130 of each pixel area PA. The encapsulation unit 200 may prevent damage of the light-emitting devices 130 due to the external impact and moisture. The encapsulation unit 200 may have a multi-layer structure. For example, the encapsulation unit 200 may include a first encapsulating layer 210, a second encapsulating layer 220 and a third encapsulating layer 230, which are sequentially stacked. The first encapsulating layer 210, the second encapsulating layer 220 and the third encapsulating layer 230 may include an insulating material. The second encapsulating layer 220 may include a material different from the first encapsulating layer 210 and the third encapsulating layer 230. For example, the first encapsulating layer 210 and the third encapsulating layer 230 may be an inorganic insulating layer made of silicon nitride (SiNx) or silicon oxide (SiOx), and the second encapsulating layer 220 may be an organic insulating layer made of an organic insulating material. Thus, in the display apparatus according to the embodiment of the present disclosure, the damage of the light-emitting devices 130 due to the external impact and moisture may be effectively prevented.

The encapsulation unit 200 may completely cover the light-emitting devices 130. For example, the display area AA of the device substrate 100 may be completely covered by the encapsulation unit 200. The bezel area BZ may be disposed outside the display area AA. For example, the display area AA may be surrounded by the bezel area BZ. At least one dam 106 may be disposed on the bezel area BZ. The dam 106 may block the flow of the second encapsulating layer 220 including an organic insulating material. For example, the second encapsulating layer 220 may be formed in a region defined by the dam 106.

Display pads 104 may be disposed on the bezel area BZ. The various signals applied to the pixel driving circuit of each pixel area PA may be provided through the display pads 104. The display pads 104 may be disposed outside the encapsulation unit 200. For example, the dam 106 may be disposed between the display area AA and the display pads 104. Thus, in the display apparatus according to the embodiment of the present disclosure, it is possible to prevent some of the display pads 104 from being unintentionally covered by the second encapsulating layer 220. Therefore, in the display apparatus according to the embodiment of the present disclosure, the distortion of the signal transmitted through the display pads 104 may be prevented.

A touch sensor Cm may be disposed on the encapsulation unit 200. The touch sensor Cm may sense a touch of user and/or a tool. For example, the touch sensor Cm may sense the presence or absence of a touch and a touch position by a change of the mutual capacitance. The touch sensor Cm may include first touch lines 310 and second touch lines 320.

A touch driving signal may be applied to the first touch lines 310. For example, the first touch lines 310 may be a touch driving line. Each of the first touch lines 310 may include first touch electrodes 311 and first bridge electrodes 312. The first touch electrodes 311 may be disposed side by side on the encapsulation unit 200. The first bridge electrodes 312 may electrically connect between the first touch electrodes 311. Each of the first bridge electrodes 312 may extend in a third direction. For example, each of the first touch electrodes 311 may be electrically connected to the adjacent first touch electrode 311 in the third direction by one of the first bridge electrodes 312.

The first touch electrodes 311 may include a conductive material. The first touch electrodes 311 may include a material having a relatively low resistance. For example, the first touch electrodes 311 may include a metal, such as titanium (Ti), copper (Cu), molybdenum (Mo) and tantalum (Ta). Each of the first touch electrodes 311 may have a multi-layer structure. For example, the first touch electrodes 311 may have a three-layer structure, such as Ti/Al/Ti, MoTi/Cu/MoTi and Ti/Al/Mo.

The first bridge electrodes 312 may include a conductive material. The first bridge electrodes 312 may include a material having a relatively low resistance. For example, the first bridge electrodes 312 may include a metal, such as titanium (Ti), copper (Cu), molybdenum (Mo) and tantalum (Ta). The first bridge electrodes 312 may include a same material as the first touch electrodes 311. Each of the first bridge electrodes 312 may have a multi-layer structure. For example, the first bridge electrodes 312 may have a three-layer structure, such as Ti/Al/Ti, MoTi/Cu/MoTi and Ti/Al/Mo. The first bridge electrodes 312 may have a same structure as the first touch electrodes 311. The first bridge electrodes 312 may be disposed on a layer same as the first touch electrodes 311. For example, each of the first bridge electrodes 312 may be in direct contact with the corresponding first touch electrodes 311.

Each of the second touch lines 320 may include second touch electrodes 321 and second bridge electrodes 322. The second touch electrodes 321 may be disposed side by side on the encapsulation unit 200. The second touch electrodes 321 may be disposed on a layer same as the first touch electrodes 311. The second touch electrodes 321 may be insulated from the first touch electrodes 311. For example, the second touch electrodes 321 may be disposed between the first touch electrodes 311. The second touch electrodes 321 may have a shape same as the first touch electrodes 311. For example, the first touch electrodes 311 and the second touch electrodes 321 may be alternately arranged on the encapsulation unit 200. Thus, in the display apparatus according to the embodiment of the present disclosure, the charges charged by the touch driving signal may be discharged through the second touch lines 320. For example, the second touch lines 320 may be a touch sensing line. Therefore, the display apparatus according to the embodiment of the present disclosure may sense the presence or absence of the touch of the user and/or the tool, and the touch position using the touch sensor Cm.

The second touch electrodes 321 may include a conductive material. The second touch electrodes 321 may include a material having a relatively low resistance. For example, the second touch electrodes 321 may include a metal, such as titanium (Ti), copper (Cu), molybdenum (Mo) and tantalum (Ta). The second touch electrodes 321 may include a same material as the first touch electrodes 311. Each of the second touch electrodes 321 may have a multi-layer structure. For example, the second touch electrodes 321 may have a three-layer structure, such as Ti/Al/Ti, MoTi/Cu/MoTi and Ti/Al/Mo. The second touch electrodes 321 may have a same structure as the first touch electrodes 311.

The second touch electrodes 321 may be disposed on a layer same as the first touch electrodes 311 and the first bridge electrodes 312. The second touch electrodes 321 may be insulated from the first bridge electrodes 312. The second touch electrodes 321 may be spaced apart from the first bridge electrodes 312. For example, the first bridge electrodes 312 may cross between the second touch electrodes 321.

The second bridge electrodes 322 may electrically connect between the second touch electrodes 321. Each of the second bridge electrodes 322 may extend in a fourth direction. For example, each of the second touch electrodes 321 may be connected to the adjacent second touch electrodes 321 in the fourth direction by one of the second bridge electrodes 322. The fourth direction may be different from the third direction. For example, the fourth direction may be perpendicular to the third direction. The second bridge electrodes 322 may cross between the first touch electrodes 311. For example, each of the second bridge electrodes 322 may intersect one of the first bridge electrodes 312. The second bridge electrodes 322 may be insulated from the first bridge electrodes 312. The second bridge electrodes 322 may be disposed on a layer different from the first bridge electrodes 312. For example, the touch sensor Cm may include an optical insulating layer 350 on the second bridge electrodes 322, and the first touch electrodes 311, the first bridge electrodes 312 and the second touch electrodes 321 may be disposed on the optical insulating layer 350.

The optical insulating layer 350 may include an insulating material. The optical insulating layer 350 may include a material having high transmittance. For example, the optical insulating layer 350 may include an organic insulating material. A thickness difference due to the second bridge electrodes 322 may be removed by the optical insulating layer 350. For example, an upper surface of the optical insulating layer 350 opposite to the device substrate 100 may be a flat surface. The first touch electrodes 311 and the second touch electrodes 321 may be in direct contact with the upper surface of the optical insulating layer 350. Thus, in the display apparatus according to the embodiment of the present disclosure, the distortion for the touch of the user and/or the tool due to a position deviation of the first touch electrodes 311 and the second touch electrode 321 may be prevented. The optical insulating layer 350 may include touch contact holes partially exposing each second bridge electrode 322. Each of the second touch electrodes 321 may be connected to the corresponding second bridge electrode 322 through one of the touch contact holes.

The second bridge electrodes 322 may include a conductive material. The second bridge electrodes 322 may include a material having a relatively low resistance. For example, the second bridge electrodes 322 may include a metal, such as titanium (Ti), copper (Cu), molybdenum (Mo) and tantalum (Ta). Each of the second bridge electrodes 322 may have a multi-layer structure. For example, the second bridge electrodes 322 may have a three-layer structure, such as Ti/Al/Ti, MoTi/Cu/MoTi and Ti/Al/Mo.

The first touch electrodes 311, the first bridge electrodes 312, the second touch electrodes 321, and the second bridge electrodes 322 of the touch sensor Cm may be disposed in the display area AA. The emission areas BEA, GEA, and REA of each pixel area PA may be disposed between the first touch electrodes 311, the first bridge electrodes 312, the second touch electrodes 321, and the second bridge electrodes 322. The first touch lines 310 and the second touch lines 320 may be disposed outside the light-emitting devices 130. For example, the first touch electrodes 311, the first bridge electrodes 312, the second touch electrodes 321 and the second bridge electrodes 322 may be disposed on the non-emission area NA of the device substrate 100. The first touch electrodes 311, the first bridge electrodes 312, the second touch electrodes 321, and the second bridge electrodes 322 may overlap the bank insulating layer 116. A plane of each first touch electrode 311 and a plane of each second touch electrode 321 may have a mesh shape including openings overlapping with the emission area BEA, GEA and REA of each pixel area PA. Thus, in the display apparatus according to the embodiment of the present disclosure, the accuracy of the touch sensing using the touch sensor Cm may be improved, and the decrease in light-extraction efficiency due to the first touch electrodes 311, the first bridge electrodes 312, the second touch electrodes 321 and the second bridge electrodes 322 of the touch sensor Cm may be minimized.

The first touch electrodes 311, the first bridge electrodes 312, the second touch electrodes 321 and the second bridge electrodes 322 may limit the direction of the light emitted from each emission area BEA, GEA, and REA. For example, the light traveling from each emission area BEA, GEA, and REA toward the adjacent non-emission area NA may be block by the first touch electrodes 311, the first bridge electrodes 312, the second touch electrodes 321, or the second bridge electrodes 322. Thus, in the display apparatus according to the embodiment of the present disclosure, mixed colors may be prevented. And, in the display apparatus according to the embodiment of the present disclosure, the viewing angle may be limited.

Touch pads 304 may be disposed on the bezel area BZ of the device substrate 100. The first touch lines 310 and the second touch lines 320 may be electrically connected to the touch pads 304 by touch routing lines 330. For example, the touch driving signal may be applied to the corresponding first touch line 310 through one of the touch pads 304. The touch pads 304 may be disposed side by side with the display pads 104. For example, the dam 106 may be disposed between the touch pads 304 and the display area AA. Thus, in the display apparatus according to the embodiment of the present disclosure, it is possible to prevent some of the touch pads 304 from being unintentionally covered by the second encapsulating layer 220. Therefore, in the display apparatus according to the embodiment of the present disclosure, the distortion of the signal transmitted through the touch pads 304 may be prevented.

A black matrix 400 may be disposed between the encapsulation unit 200 and the optical insulating layer 350. The black matrix 400 may block light. For example, the black matrix 400 may overlap the non-emission area NA of the device substrate 100. The black matrix 400 may be disposed between the emission areas BEA, GEA and REA. For example, a plane of the black matrix 400 may be a shape surrounding the emission areas BEA, GEA and REA. Thus, in the display apparatus according to the embodiment of the present disclosure, the light emitted from each emission area BEA, GEA, and REA toward the adjacent non-emission area NA may be block by the black matrix 400, and the light traveling toward the adjacent non-emission area NA in the optical insulating layer 350 may be block by the first touch electrodes 311 and the second touch electrodes 321. Therefore, in the display apparatus according to the embodiment of the present disclosure, the mixed colors may be effectively prevented.

Each of the second bridge electrodes 322 may overlap the black matrix 400. For example, each of the second bridge electrodes 322 may be disposed between the black matrix 400 and the optical insulating layer 350. Each of the second bridge electrodes 322 may be in direct contact with an upper surface of the black matrix 400 opposite to the device substrate 100. Each of the second bridge electrodes 322 may have a size smaller than the black matrix 400. For example, a lower surface of each second bridge electrode 322 toward the device substrate 100 may be completely hid by the black matrix 400. Thus, in the display apparatus according to the embodiment of the present disclosure, the reflection of the light emitted from each emission area BEA, GEA and REA by the second bridge electrodes 322 may be prevented.

Therefore, in the display apparatus according to the embodiment of the present disclosure, decreasing the quality of the image due to the light reflected by the second bridge electrodes 322 may be prevented.

A lens assembly 500 may be disposed on the touch sensor Cm. The lens assembly 500 may include a plurality of optical lens 510. The optical lenses 510 may be disposed on a path of the light emitted from the emission areas BEA, GEA and REA. For example, each of the optical lenses 510 may overlap one of the emission areas BEA, GEA and REA. Each of the optical lenses 510 may concentrate the light emitted from the corresponding emission areas BEA, GEA and REA. For example, a lower surface of each optical lens 510 toward the device substrate 100 may be a flat surface, and a surface of each optical lens 510 may be a semicircular shape. The optical lenses 510 may be disposed side by side on the optical insulating layer 350. For example, the lower surface of each optical lens 510 may be in direct contact with the optical insulating layer 350. A plane shape of the lower surface of each optical lens 510 may be a circle shape. Thus, in the display apparatus according to the embodiment of the present disclosure, the front luminance of each pixel area PA may be improved. The optical lenses 510 may be in direct contact with the upper surface of the optical insulating layer 350. Therefore, in the display apparatus according to the embodiment of the present disclosure, a diffraction deviation according to a position difference of incident light to each optical lens 510 may be prevented.

The lens assembly 500 may include a lens passivation layer 520 on the optical lenses 510. Each of the optical lenses 510 may be covered by the lens passivation layer 520. For example, the surface of each optical lens 510 having a semicircular shape may be in direct contact with the lens passivation layer 520. The lens passivation layer 520 may include an insulating material. For example, the lens passivation layer 520 may include organic insulating material. A thickness difference due to the optical lenses 510 may be removed by the lens passivation layer 520. For example, an upper surface of the lens passivation layer 520 opposite to the device substrate 100 may be a flat surface. Thus, in the display apparatus according to the embodiment of the present disclosure, a luminance deviation according to a position difference of emitting light from each pixel area PA may be prevented. The refractive index of the lens passivation layer 520 may be smaller than the refractive index of each optical lens 510. Therefore, the display apparatus according to the embodiment of the present disclosure may prevent the light passing through each optical lens 510 from being reflected in the direction of the device substrate 100 due to a difference in refractive index between the corresponding optical lens 510 and the lens passivation layer 520.

Lens barriers 350b may be disposed between the optical lenses 510. Each of the optical lenses 510 may be surrounded by one of the lens barriers 350b. For example, each of the lens barriers 350b may extend along an edge of one of the optical lenses 510. Each of the optical lenses 510 may be formed in a region defined by the corresponding lens barrier 350b. Thus, in the display apparatus according to the embodiment of the present disclosure, deform of each optical lens 510 due to a forming process may be prevented. For example, in the display apparatus according to the embodiment of the present disclosure, the contact between adjacent optical lenses 510 in a reflow process may be prevented by the lens barriers 350b. Therefore, in the display apparatus according to the embodiment of the present disclosure, decreasing the quality of the image due to a process of forming the optical lenses 510 may be prevented.

In this display apparatus according to the embodiment of the present disclosure, the light-emitting device 130 may include a first light-emitting device 130 in the first emission area (e.g., BEA in FIG. 4) and a second light-emitting device 130 in a second adjacent emission area (e.g., GEA in FIG. 4). The optical insulating layer 350 may be disposed on the first light-emitting device and the second light-emitting device, which may be disposed on the substrate. The optical lens 510 may include a first optical lens 510 on the optical insulating layer 350 to overlap the first light-emitting device 130, and a second optical lens 510 on the optical insulating layer 350 to overlap the second light-emitting device 130.

The lens barrier 350b may be disposed on the optical insulating layer 350, such that the lens barrier 350b protrudes above the optical insulating layer 350 in a first direction (e.g., light emitting direction) the lens barrier 350b may be disposed between the first optical lens 510 and the second optical lens 510. A second lens barrier may be formed adjacent to the second optical lens similarly. For example, the lens barrier 350b may include a first lens barrier 350b disposed adjacent to the first optical lens 510 and a second lens barrier 350b disposed adjacent to the second optical lens 510.

An edge of each optical lens 510 may be in direct contact with the corresponding lens barrier 350b. For example, a plane of each lens barrier 350b may have a shape same as an outline of the corresponding optical lens 510. Thus, in the display apparatus according to the embodiment of the present disclosure, a plane shape of each optical lens 510 may be defined by the corresponding lens barrier 350b. Therefore, in the display apparatus according to the embodiment of the present disclosure, deform of each optical lens 510 due to a forming process may be effectively prevented by the lens barriers 350b.

The lens barriers 350b may include an insulating material. The lens barriers 350b may be disposed between the optical lenses 510, the first touch electrodes 311 and the second touch electrodes 321. For example, the lens barriers 350b may be in direct contact with the upper surface of the optical insulating layer 350. The lens barriers 350b may include a same material as the optical insulating layer 350. A process of forming the first touch electrodes 311, the first bridge electrodes 312, the second touch electrodes 321 and the optical lenses 510 may be performed after the formation of the lens barriers 350b. For example, a process of forming the lens barriers 350b may include a process of recessing a portion of the optical insulating layer 350 overlapping with the first touch electrodes 311, the first bridge electrodes 312, the second touch electrodes 321 and the optical lenses 510, which are formed by a subsequent process. Thus, in the display apparatus according to the embodiment of the present disclosure, a process of forming the lens barriers 350b may be simplified. Thus, in one embodiment, at least a part of the touch electrode (e.g., part of first touch electrodes 311, the first bridge electrodes 312, the second touch electrodes 321, or second bridge electrodes 322) may be disposed between a first optical lens 510 and a second optical lens 510, and also in between a first lens barrier 350b and a second lens barrier 350b.

Each of the lens barriers 350b may overlap an edge of the black matrix 400. For example, the lens barriers 350b may be disposed on the non-emission area NA of the device substrate 100. A size of each optical lens 510 may be larger than a size of the corresponding emission area BEA, GEA and REA. For example, an edge of each optical lens 510 may overlap the black matrix 400. Each of the lens barriers 350b may be disposed on the upper surface of the black matrix 400. For example, a distance between the optical lenses 510 may have a size smaller than the non-emission area NA. Thus, in the display apparatus according to the embodiment of the present disclosure, the light-extraction efficiency may be improved.

A thickness of each lens barrier 350b may be larger than a thickness of each touch electrode 311 and 321. Thus, the display apparatus according to the embodiment of the present disclosure may prevent a portion of the surface of each optical lens 510 having a semicircular shape from being covered by the first touch electrodes 311, the first bridge electrodes 312 or the second touch electrodes 321. Therefore, in the display apparatus according to the embodiment of the present disclosure, decreasing the light-extraction efficiency due to the touch sensor Cm may be prevented.

Accordingly, the display apparatus according to the embodiment of the present disclosure may include the black matrix 400, the optical lenses 510, the touch electrodes 311 and 321 and the lens barriers 350b, which are disposed on the encapsulation unit 400 covering the light-emitting devices 130, wherein the optical lenses 510, the touch electrodes 311 and 321 and the lens barriers 350b may be disposed on the optical insulating layer 350 covering the black matrix 400, wherein the black matrix 400 and the touch electrodes 311 and 321 may overlap the non-emission area NA of the device substrate 100, and wherein each of the optical lenses 510 overlapping with the light-emitting devices 130 may be surrounded by the lens barriers 350b. Thus, the display apparatus according to the embodiment of the present disclosure may prevent each optical lens 510 from contacting adjacent optical lens 510 due to a forming process. Therefore, in the display apparatus according to the embodiment of the present disclosure, decreasing the quality of the image due to a process of forming the optical lenses 510 may be prevented.

The display apparatus according to the embodiment of the present disclosure is described that the black matrix 400 has a same area as the non-emission area NA. However, in the display apparatus according to another embodiment of the present disclosure, the black matrix 400 may have a size smaller than the non-emission area NA. That is, in the display apparatus according to another embodiment of the present disclosure, the black matrix 400 may be formed between the emission areas BEA, GEA and REA to be narrower than the non-emission area NA. Thus, the display apparatus according to another embodiment of the present disclosure may prevent the black matrix 400 from being formed on the emission areas BEA, GEA and REA due to misalignment or process error. Therefore, in the display apparatus according to another embodiment of the present disclosure, the loss of the light due to the black matrix 400 may be prevented.

The display apparatus according to the embodiment of the present disclosure is described that the optical lenses 510 are formed by a reflow process. However, in the display apparatus according to another embodiment of the present disclosure, the optical lenses 510 may be formed in various ways. For example, in the display apparatus according to the embodiment of the present disclosure, the optical lenses 510 may be formed in regions defined by the lens barriers 350b by ink-jet process. Thus, in the display apparatus according to another embodiment of the present disclosure, the flow of material applied for forming each optical lens 510 may be blocked by the lens barriers 350b. That is, in the display apparatus according to another embodiment of the present disclosure, the optical lenses 510 having the same shape may be formed in various ways. Therefore, in the display apparatus according to another embodiment of the present disclosure, the degree of freedom for a process of forming the optical lenses 510 may be improved.

Figure 5:
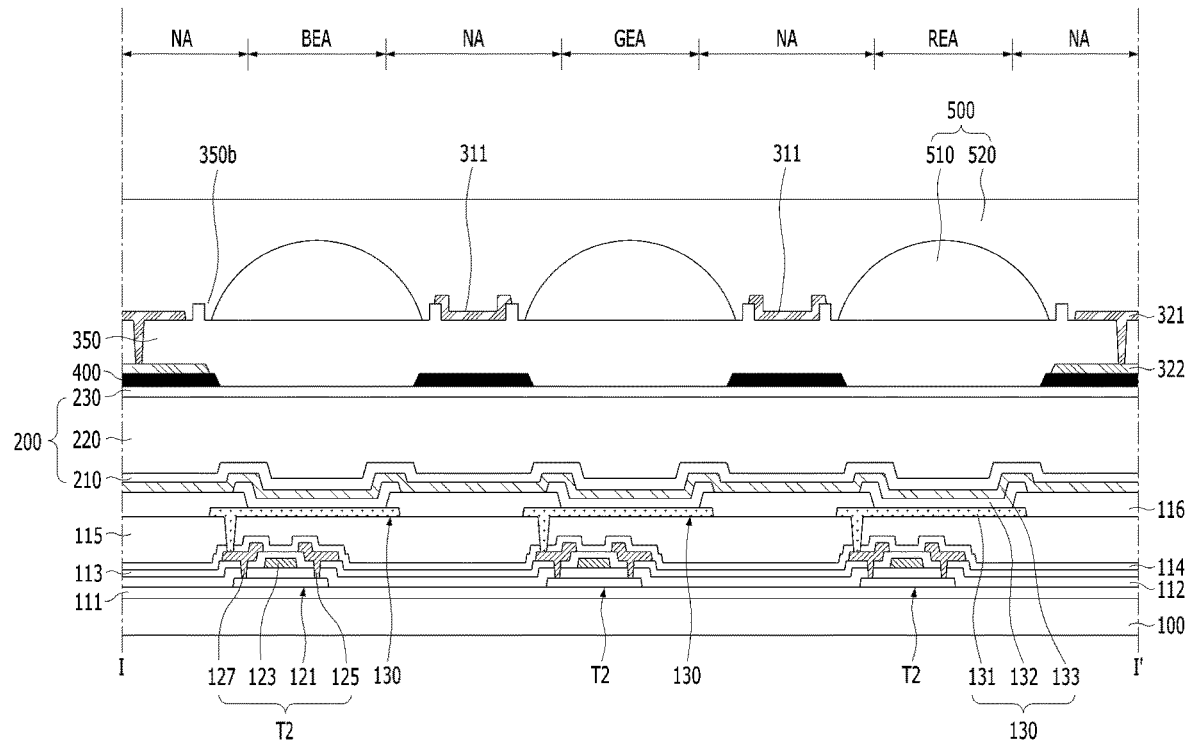
FIGS. 5 to 9 are views showing the display apparatus according to another embodiment of the present disclosure, respectively.

In the display apparatus according to another embodiment of the present disclosure, the lens barriers 350b may be spaced apart from the optical lenses 510. For example, in the display apparatus according to another embodiment of the present disclosure, an end of some of the touch electrodes 311 and 321 may be disposed on adjacent lens barrier 350b, as shown in FIG. 5. Thus, in the display apparatus according to another embodiment of the present disclosure, the formation region of each optical lens 510 may be variously set.

Figure 6:
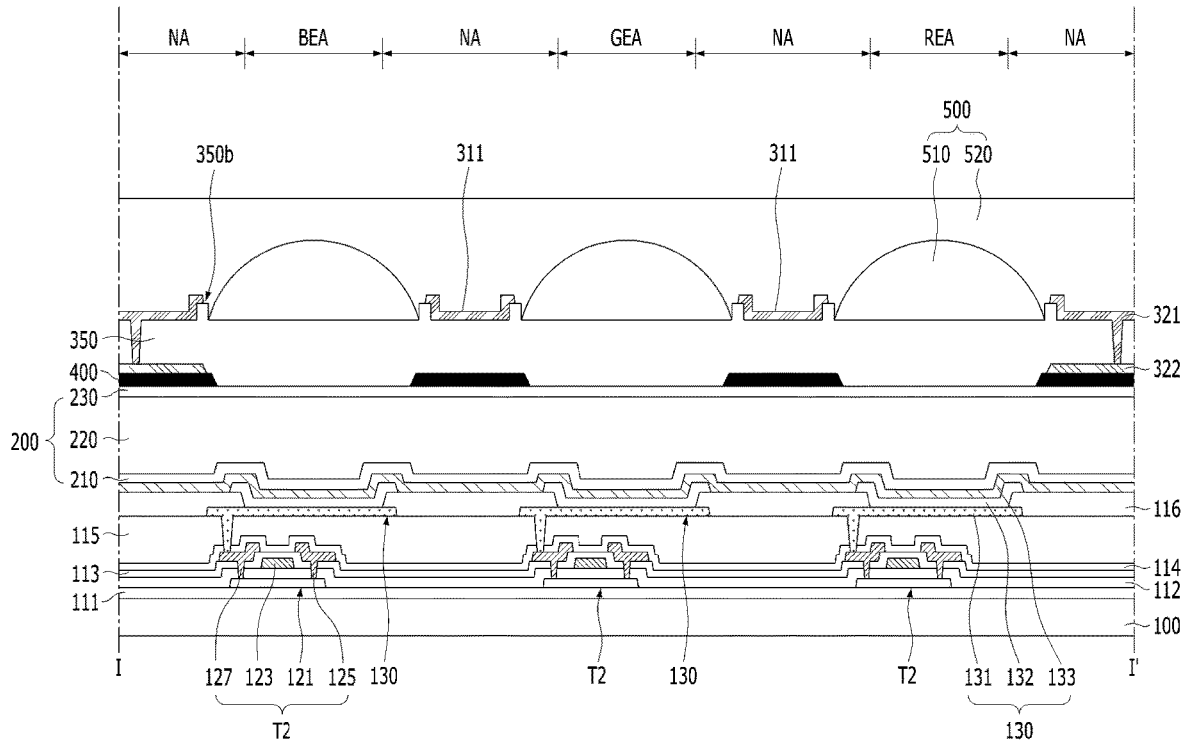

The display apparatus according to the embodiment of the present disclosure is described that the touch electrodes 311 and 321 are disposed between the lens barriers 350b. However, in the display apparatus according to another embodiment of the present disclosure, an end of each touch electrode 311 and 321 may be disposed on adjacent lens barrier 350b, as shown in FIG. 6. Thus, in the display apparatus according to another embodiment of the present disclosure, a size of each touch electrode 311 and 321 may be increased or maximized. Therefore, in the display apparatus according to another embodiment of the present disclosure, deform of the optical lenses 510 may be prevented, and accuracy of the touch sensing of the user and/or the tool may be improved.

Figure 7:
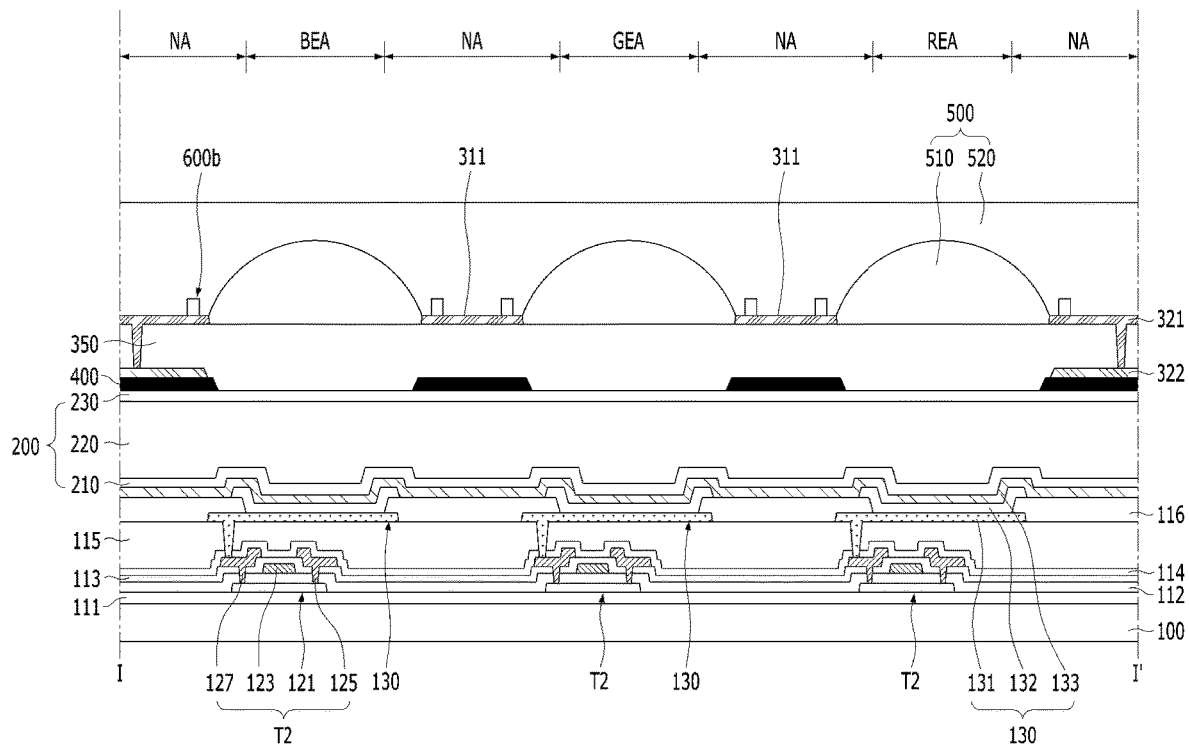

The display device according to the embodiment of the present disclosure is described that the lens barriers 350b are in direct contact with the optical insulating layer 350. However, in the display apparatus according to another embodiment of the present disclosure, the lens barriers 350b may include a material different from the optical insulating layer 350. For example, in the display apparatus according to another embodiment of the present disclosure, each of the lens barriers 600b may be disposed on an edge of one of the touch electrodes 311 and 321, as shown in FIG. 7. The lens barriers 600b may be formed of inorganic insulating material or organic insulating material. An end of each touch electrode 311 and 321 may be disposed between the optical insulating layer 350 and one of the lens barriers 600b. A first lens barrier 600b and a second lens barrier 600b may be disposed on the part of the touch electrode disposed between a first optical lens and a second optical lens. Thus, in the display apparatus according to another embodiment of the present disclosure, each of the optical lenses 510 may be in contact with an end of adjacent touch electrodes 311 and 321. That is, in the display apparatus according to another embodiment of the present disclosure, the flow of each optical lens 510 may be blocked by the ends of the touch electrodes 311 and 321 and the lens barriers 600b. Therefore, in the display apparatus according to another embodiment of the present disclosure, the degree of freedom for the location of the lens barriers 600b may be improved.

Figure 8:
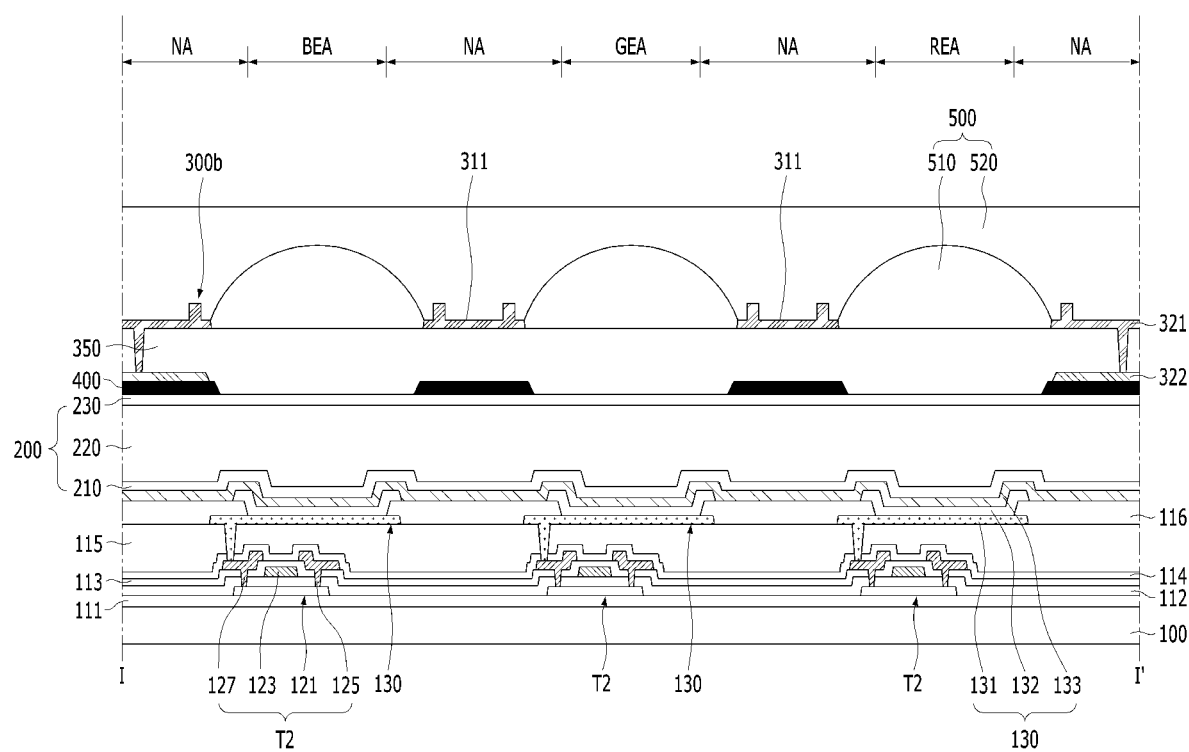

The display apparatus according to the embodiment of the present disclosure is described that the lens barriers 350b include an insulating material. However, in the display apparatus according to another embodiment of the present disclosure, the lens barriers 350b may be formed of metal. For example, in the display apparatus according to another embodiment of the present disclosure, each of the lens barriers 300b may be disposed an edge of one of the touch electrodes 311 and 321, wherein the lens barriers 300b may be formed using a process of forming the touch electrodes 311 and 321, as shown in FIG. 8. For example, the lens barriers 300b may include a same material as the touch electrodes 311 and 321. Thus, a first lens barrier 300b and a second lens barrier 300b may extend from the part of the touch electrode between the first optical lens 510 and the second optical lens 510 to protrude in the first direction. Thus, in the display apparatus according to another embodiment of the present disclosure, the degree of freedom for a process of forming the lens barriers 600b may be improved.

The display apparatus according to the embodiment of the present disclosure is described that the plane shape of the lower surface of each optical lens 510 is a circle shape. However, in the display apparatus according to another embodiment of the present disclosure, a plane of a region defined by each lens barrier 350b may be a polygonal shape. For example, in the display apparatus according to another embodiment of the present disclosure, the optical lenses 510 may be formed in regions defined by the lens barriers 350b, wherein a plane shape of the lower surface of each optical lens 510 may be pentagonal or hexagonal. An edge of each optical lens 510 may be in contact with a side of the corresponding lens barrier 350b. Thus, in the display apparatus according to another embodiment of the present disclosure, the degree of freedom for a shape of the lower surface of each optical lens 510 may be improved.

Figure 9:
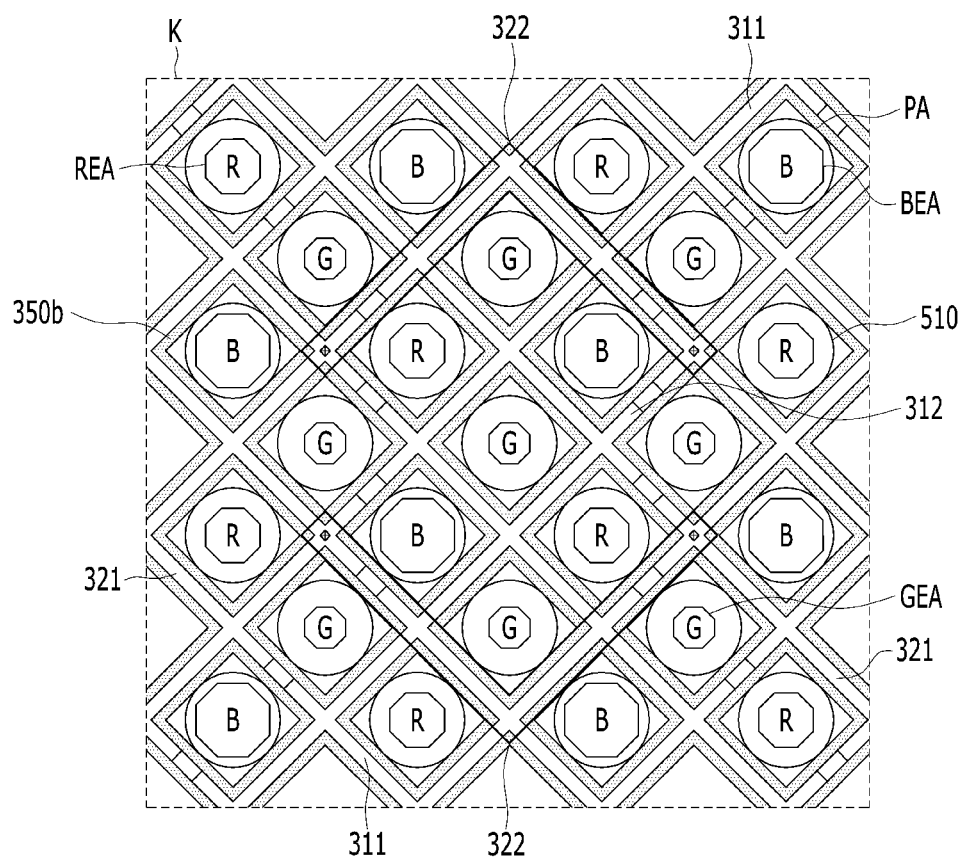

The display apparatus according to the embodiment of the present disclosure is described that each of the lens barriers 350b extend along an edge of the corresponding optical lens 510. However, in the display apparatus according to another embodiment of the present disclosure, a plane of each lens barrier 350b may have a shape different from an outline of the corresponding optical lens 510. For example, in the display apparatus according to another embodiment of the present disclosure, a plane of each lens barrier 350b may be a polygon such as a square, a pentagon, and a hexagon. In the display apparatus according to another embodiment of the present disclosure, a plane shape of the lower surface of each optical lens 510 may be a circle shape, a plane of each lens barrier 350b may be a square surrounding the corresponding emission area BEA, GEA and REA, as shown in FIG. 9. The optical lens 510 of each emission area BEA, GEA and REA may have a shape of inscribed circular with the corresponding lens barrier 350b. A side of each first touch electrode 311 and a side of each second touch electrode 321 may be in contact with one of the lens barriers 350b. Thus, in the display apparatus according to another embodiment of the present disclosure, the degree of freedom for a plane shape of the lens barriers 350b may be improved.

In the result, the display apparatus according to the embodiments of the present disclosure may comprise the black matrix, the optical lens, the touch electrode and the lens barrier, which are disposed on the encapsulation unit covering the light-emitting device, wherein the optical lens, the touch electrode and the lens barrier may be disposed on the optical insulating layer covering the black matrix, wherein the touch electrode may overlap the black matrix, and wherein the optical lens overlapping with the light-emitting device may be surrounded by the lens barrier. Thus, in the display apparatus according to the embodiments of the present disclosure, deform of the optical lens due to a reflow process may be prevented. Thereby, in the display apparatus according to the embodiments of the present disclosure, decreasing the quality of the image due to a process of forming the optical lens may be prevented.

What is claimed is:

1. A display apparatus comprising:
    a bank insulating layer on a device substrate, the bank insulating layer defining an emission area;
    a light-emitting device on the emission area of the device substrate;
    an encapsulation unit on the bank insulating layer and the light-emitting device;

a black matrix on the encapsulation unit, the black matrix overlapping with the bank insulating layer;

an optical lens on the encapsulation unit, the optical lens overlapping with the emission area;

an optical insulating layer disposed between the encapsulation unit and the optical lens, the black matrix being disposed on the optical insulating layer;

a touch electrode on the optical insulating layer, the touch electrode overlapping with the black matrix; and a lens barrier on the optical insulating layer, the lens barrier surrounding the optical lens.

2. The display apparatus according to claim 1, wherein the lens barrier includes an insulating material.

3. The display apparatus according to claim 1, wherein the lens barrier is in contact with an edge of the optical lens.

4. The display apparatus according to claim 3, wherein the lens barrier extends along the edge of the optical lens.

5. The display apparatus according to claim 1, wherein the lens barrier is in contact with an upper surface of the optical insulating layer opposite to the device substrate.

6. The display apparatus according to claim 5, wherein the lens barrier includes a same material as the optical insulating layer.

7. The display apparatus according to claim 1, further comprising a bridge electrode between the black matrix and the optical insulating layer, the bridge electrode electrically connected to the touch electrode.

8. The display apparatus according to claim 7, wherein the bridge electrode is in contact with an upper surface of the black matrix toward the touch electrode.

9. The display apparatus according to claim 1, wherein an end of the touch electrode is disposed on the lens barrier.

10. The display apparatus according to claim 1, wherein a thickness of the lens barrier is larger than a thickness of the touch electrode.

11. A display apparatus comprising:

a device substrate including emission areas and a non-emission area between the emission areas;

light-emitting devices on the emission areas of the device substrate;

an encapsulation unit on the light-emitting devices, the encapsulating unit extending on the non-emission area of the device substrate;

a black matrix on the encapsulation unit, the black matrix overlapping with the non-emission areas;

an optical insulating layer on the black matrix, the optical insulating layer extending on the emission areas of the device substrate;

touch electrodes on the optical insulating layer, the touch electrodes overlapping with the black matrix;

optical lenses on the optical insulating layer, the optical lenses overlapping with the emission areas; and lens barriers between the optical lenses on the optical insulating layer.

12. The display apparatus according to claim 11, wherein each of the optical lenses is surrounded by the lens barriers, wherein a plane of each lens barriers has a shape different from an outline of the corresponding optical lens.

13. The display apparatus according to claim 11, wherein each of the lens barriers is disposed on an edge of one of the touch electrodes.

14. The display apparatus according to claim 13, wherein the lens barriers include a same material as the touch electrodes.

15. The display apparatus according to claim 13, wherein the lens barriers are spaced apart from the optical lenses.

16. A display apparatus, comprising:

a substrate having a first emission area and a second emission area;

a first light-emitting device in the first emission area and a second light-emitting device in the second emission area;

an optical insulating layer on the first light-emitting device and the second light-emitting device;

a first optical lens on the optical insulating layer, wherein at least a portion of the first optical lens overlaps with the first light-emitting device;

a second optical lens on the optical insulating layer, wherein at least a portion of the second optical lens overlaps with the second light-emitting device; and a lens barrier on the optical insulating layer, wherein the lens barrier protrudes above the optical insulating layer in a first direction and is disposed between the first optical lens and the second optical lens.

17. The display apparatus of claim 16, further comprising at least a part of a touch electrode on the optical insulating layer, the part of the touch electrode disposed between the first optical lens and the second optical lens.

18. The display apparatus of claim 17, further comprising a second lens barrier on the optical insulating layer adjacent to the second optical lens, and wherein the part of the touch electrode is between the first lens barrier and the second lens barrier.

19. The display apparatus of claim 17, wherein the first optical lens contacts a side surface of the part of the touch electrode, and the lens barrier is disposed on an upper surface of the part of the touch electrode.

20. The display apparatus of claim 17, wherein the lens barrier extends from the part of the touch electrode to protrude in the first direction, and the lens barrier is formed of a same material as the part of the touch electrode.

* * * * *